United States Patent [19]
Drost et al.

[11] Patent Number: 5,920,215
[45] Date of Patent: Jul. 6, 1999

[54] TIME-TO-CHARGE CONVERTER CIRCUIT

[75] Inventors: Robert J. Drost, Palo Alto; Robert J. Bosnyak, San Jose, both of Calif.

[73] Assignee: Sun Microsystems, Inc., Palo Alto, Calif.

[21] Appl. No.: 08/885,048

[22] Filed: Jun. 30, 1997

[51] Int. Cl.[6] .................................................. H03L 7/06
[52] U.S. Cl. ............................................. 327/157; 327/163
[58] Field of Search .................................. 327/51, 52, 157, 327/162, 163, 563; 330/253, 255, 258, 261, 267

[56] References Cited

U.S. PATENT DOCUMENTS

| | | | |
|---|---|---|---|
| 5,151,625 | 9/1992 | Zarabadi et al. | 307/529 |
| 5,335,948 | 8/1994 | Fong et al. | 330/253 |
| 5,422,529 | 6/1995 | Lee | 327/536 |
| 5,530,403 | 6/1996 | Bushman et al. | 330/253 |
| 5,561,392 | 10/1996 | Kimura | 327/563 |
| 5,734,296 | 3/1998 | Dotson et al. | 330/253 |
| 5,808,513 | 9/1998 | Archer | 330/253 |

OTHER PUBLICATIONS

F.M. Gardener, "Charge–Pump Phase–Lock Loops," IEEE, vol. Com–28, No. 11 (Nov. 1980), 1849–1857.

D–K Jeong, et al., "Design of PLL–Based Clock Generation Circuits," *IEEE Journal of Solid State Circuits*, vol. SC–22, (Apr. 1987), pp. 255–261.

W.F. Egan, Ph.D., "Frequency Synthesis by Phase Lock," John Wiley & Sons (©1981) [ISBN 0–471–08202–3], pp. 115–123.

J. Alvarez, et al., "A Wide Bandwidth Low–Voltage PLL for PowerPc™ Microprocessors," reprinted from *IEEE Journal of Solid State Circuits*, vol. SC–30 (Apr. 1995), pp. 383, 391.

*Primary Examiner*—Terry D. Cunningham
*Assistant Examiner*—Jung Ho Kim
*Attorney, Agent, or Firm*—Philip H. Albert; Townsend and Townsend and Crew

[57] ABSTRACT

In a charge pump the noise due to switching transients on the input pulse lines is kept to extremely low levels by translating input up/down pulses into small signal differential pulses which swing a differential pair of transistors by a small amount. This is done with level converters. The differential pair is kept in a saturation region, so that a large swing is not needed from the level converters and channel creation/destruction noise is avoided in addition to the noise reduction due to smaller swings. To avoid inherent offsets which might require a nonzero delta time width difference in the input pulses to produce a zero delta current, identical differential structures are used at the inputs for the two input pulse signals.

9 Claims, 5 Drawing Sheets

TIME-TO-CHARGE CONVERTER CIRCUIT

BACKGROUND OF THE INVENTION

The present invention relates to time-to-charge conversion with low jitter and phase offset in a phase/frequency locking loop, as might be used in an integrated circuit requiring clock recovery. More specifically, one embodiment of the present invention provides a "time-to-charge" converter circuit which addresses the problem of conversion of a delta time width between two input signal pulses into a delta current while minimizing the noise generated and producing a zero delta current when an input delta time width is zero.

One application of a time-to-charge converter is a charge pump of a phase-locked loop ("PLL"), where a delta time between a reference clock edge and an oscillator clock edge is converted to a delta current (charge) to be sinked into or sourced from a capacitor in a loop filter at the input of a voltage controlled oscillator ("VCO") which outputs the oscillator clock.

Frequency synthesis using phase information and PLL's is known in the art. See, for example, Egan, W., *Frequency Synthesis by Phase*, pp. 115–123 (1981) and Gardner, F. M., "Charge-Pump Phase-Lock Loops", *IEEE Trans. on Comm.*, Vol. COM-28, No. 11, pp. 1849–1858 (1980), which are incorporated by reference herein for all purposes.

A PLL typically comprises a phase/frequency detector with a reference clock input and an oscillator clock input (the clocks being locked). The outputs of the detector are up/down pulse signals. A pulse signal from the detector has a width which is a function of the timing between the two clock inputs. One of the pulse signals has a width that is related to a lag period between an edge of the reference clock and an edge of the oscillator clock, while the other pulse signal has a width that is related to a lead period between an edge of the reference clock and an edge of the oscillator clock. Where there is neither lag nor lead, the pulses are at their minimum. The minimum pulse width can be zero, but is more often a function of a delay through a signal path in the detector. The pulse widths for the up and down signals are also equal, unless there is an offset in the charge pump which requires an offset in the input to have a zero delta current at the output.

These two pulse signals connect to a charge pump which sinks current during a pulse of one of the signals and sources current during a pulse of the other signal. The particular implementation determines which of the up/down outputs correspond to lagging/leading and current sourcing/sinking. In any case, the sourcing and sinking of current affects a voltage across a capacitor (which may be part of a low-pass loop filter), where that voltage in turn is an input to a VCO which outputs the oscillator clock.

Where the PLL is to be implemented in an integrated circuit ("IC"), the problem of where to put the capacitor arises. The capacitor can either be on-chip or off-chip. If the capacitor is on-chip, it might take up large amounts of valuable chip area. Furthermore, large on-chip capacitors tend to pick up signals from unrelated circuits found elsewhere on the chip. If the capacitor is placed off-chip, additional leads must be provided from the IC package to accommodate connection to the external capacitor. Another disadvantage of an off-chip capacitor is the additional labor required to install it relative to the on-chip capacitor.

Unless chip space is freely available or the minimum size (capacitance) of the capacitor is small, the capacitor would have to be off-chip. However, a loop filter capacitor cannot be arbitrarily small, as it must be large enough to absorb the delta current ($\Delta I$, or charge q) sourced or sinked by the charge pump. The delta current cannot be arbitrarily small, as it must be somewhat larger than the noise impinging on the capacitor (noise due to leakage current and noise from the charge pump itself).

Previous charge pumps injected noise into the delta current from several sources. One source is the inputs to the charge pump. In a CMOS circuit where the inputs switch from 3.3 volts to 0.0 volts, the switching will often cause high-frequency transients at the output due to circuit coupling. Another source of noise is the output stage transistors. As the output stage transistors in a charge pump are switched on and off, they must charge and discharge to create and destroy the channel between the drain and source of the transistor. This charge must go somewhere, some of which ends up at the charge pump outputs. If the channel charge from each of the output stage transistors is equal, the dumping of charge onto both charge pump outputs might have little effect on the VCO, as it would cause at most a common mode shift in the capacitor voltage. However, due to process and other variations, it is difficult to make transistors with all the same channel charge characteristics. Where a mismatch occurs in the amount of channel charge stored and storable in the output stage transistors, the charging and discharging of those transistors results in a spurious signal.

Aside from the problem of noise, previous IC-based charge pumps also suffered from mismatches among components. IC's are subject to variations due to process, temperature and voltage variations and these variations will often lead to an imbalance which results in a circuit requiring a nonzero delta time width at the input to reach a zero delta current at the output. This delta time width difference could be adjusted for elsewhere in the PLL, but is not a well controlled quantity, as it varies across varied process, temperature and voltage conditions.

Therefore, what is needed is a PLL with a charge pump which can be implemented as part of an IC to convert a delta time to a delta current where the PLL operates with a low delta current requirement, where the charge pump does not generate large amounts of noise when either of the two input pulse signals has a rising or falling edge and where the charge pump does not require a nonzero delta time width for a zero delta current, or vice versa.

SUMMARY OF THE INVENTION

In one embodiment of a charge pump according to the resent invention, the noise due to switching transients on the input pulse lines is kept to extremely low levels by translating input up/down pulses into small signal differential pulses which swing a differential pair of transistors by a small amount and by keeping the differential pair in saturation. The level translation is done with level converters. With the differential pair in saturation, a small swing from the level converters is sufficient. Furthermore, channel creation/destruction noise is avoided in addition to the noise reduction due to smaller swings. To avoid inherent offsets which might require a nonzero delta time width difference in the input pulses to produce a zero delta current, identical differential structures are used at the inputs for the two input pulse signals, and their complements if used.

One advantage of the present invention is that when the charge pump is used with a known phase-frequency detector which produces two pulses of exactly the same width when there is zero phase difference between the input and retimed signal, linear second-order effects, such as feedthrough by overlap capacitance, cancel each other since the effects happen differentially in an exactly inverse fashion. The nonlinear second order effects of channel creation/destruction in the output stage transistors are avoided because those transistors are kept in saturation. With the output transistors in saturation, the charge pump presents a high impedance output.

Another advantage of the present invention is that, because switching and/or transient noise is reduced, the converter can operate with extremely small currents, thereby allowing for a smaller integrating loop capacitor.

A further understanding of the nature and advantages of the inventions herein may be realized by reference to the remaining portions of the specification and the attached drawings.

DESCRIPTION OF THE PREFERRED EMBODIMENTS

Figure 1:
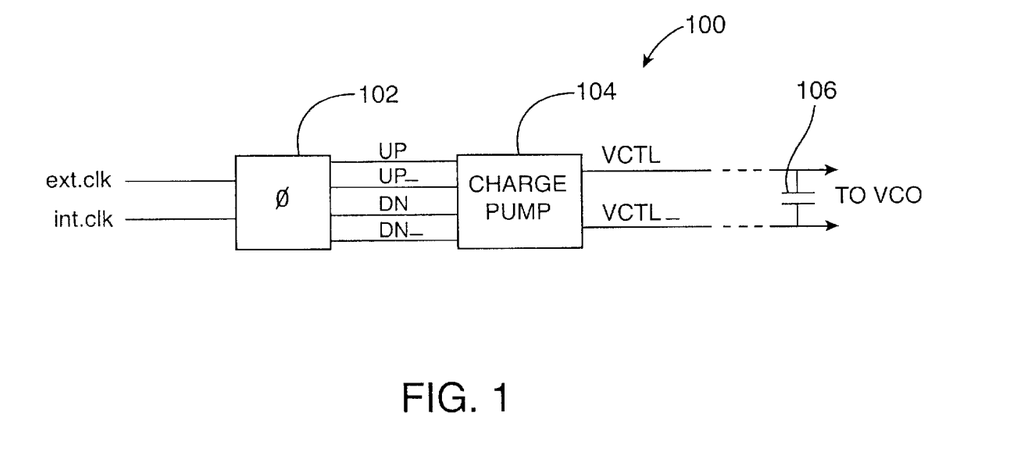
FIG. 1 is a block diagram of a PLL according to the present invention.

FIG. 1 shows a circuit 100 including a phase-frequency detector 102, a charge pump 104 and a loop capacitor 106. Phase-frequency detector 102 receives as its input and reference clock (ext_clk) and an oscillator clock (int_clk). Phase-frequency detector 102 is shown with four outputs: UP, its complement UP_ (together, "the UP signal"), DN (down) and its complement DN_ (together, "the DOWN signal"). These four outputs are inputs to charge pump 104. Charge pump 104 is shown with two outputs, Vctl and its complement Vctl_, which are coupled, directly or indirectly, to respective ends of a loop capacitor 106. Loop capacitor 106 is coupled to a VCO (not shown) such that the charge in loop capacitor 106 affects the phase-frequency of the oscillator clock.

In operation, circuit 100 keeps the oscillator clock in lock with the reference clock. To do this, phase-frequency detector 102 activates the UP signal at a reference clock edge and deactivates the UP signal at an oscillator clock edge. Thus, the UP signal comprises pulses which are have a width related to the lag period between the reference clock and the oscillator clock (because of the signal delay, it is not exact, but since both pulses has similar delays, its effect cancels out). Likewise, phase-frequency detector 102 activates the DOWN signal in a similar manner when the oscillator clock leads the reference clock. When the UP signal is activated, charge pump 104 sources or sinks current (depending on the sign of the VCO's input) and does the opposite when the DOWN signal is activated.

Figure 2:
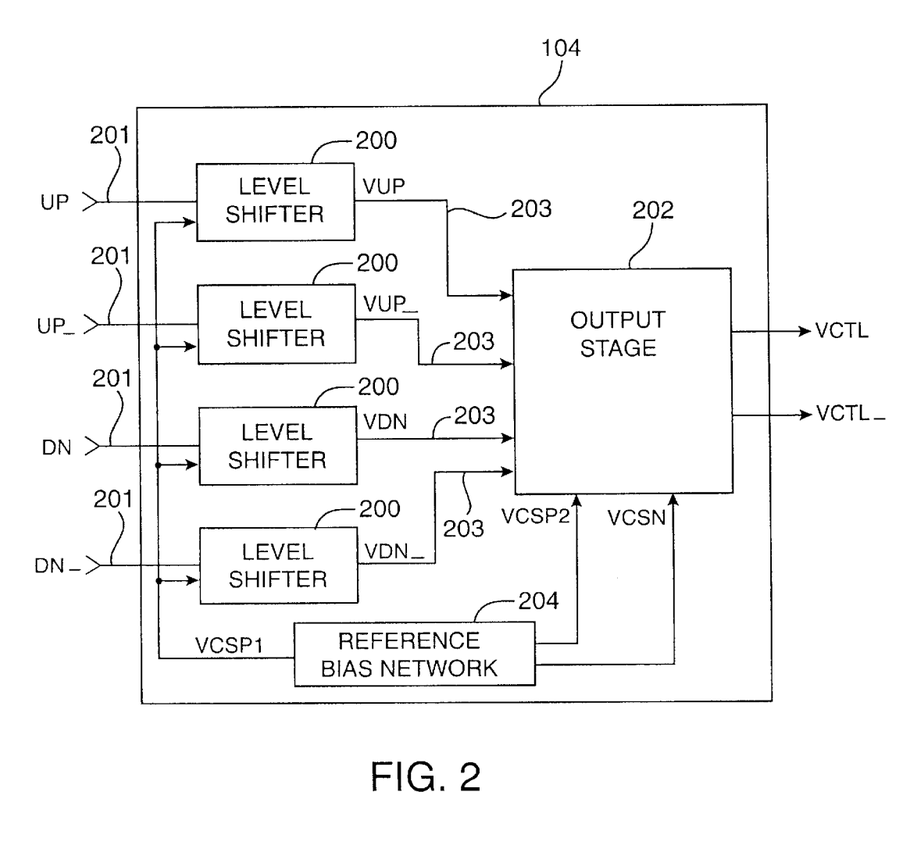
FIG. 2 is a block diagram of a charge pump according to the present invention as might be used in the circuit shown in FIG. 1.

FIG. 2 shows charge pump 104 in further detail. As shown, charge pump 104 includes four level shifters 200, one per input line 201, which shift the UP, UP_, DN and DN_ inputs to intermediate signals VUP, VUP_, VDN and VDN_, respectively. Charge pump 104 also includes an output stage 202 which takes in the intermediate signals 203 (VUP, VUP_, VDN and VDN_) and outputs delta current on lines Vctl and Vctl_. Level shifters 200 and output stage 202 are supplied with reference voltages, whose relationships are described in more detail below, from a reference bias network 204. More specifically, reference bias network 204 supplies a reference voltage VCSP1 to all of the level shifters 200 and supplies reference voltages VCSP2 and VCSN to output stage 202.

As explained below in connection with FIG. 5, VCSP1 and VCSP2 are generated to be equal, but isolated, reference voltages. This isolation prevents noise from the full voltage swings on the charge pump input lines 201 from reaching output stage 202. In a specific embodiment described herein, charge pump 104 is implemented in 3.3 volt CMOS technology and input lines 201 switch between 0.0 volts and 3.3 volts, while intermediate signals 203 switch between 2.0 volts and 2.2 volts.

In operation, output stage 202 accepts intermediate signals 203 from the level shifters 200 and uses those signals to generate the Vctl and Vctl_ outputs. This is described below in greater detail in connection with FIG. 4, but first the details of the level shifters 200 are described with reference to FIG. 3.

Figure 3:
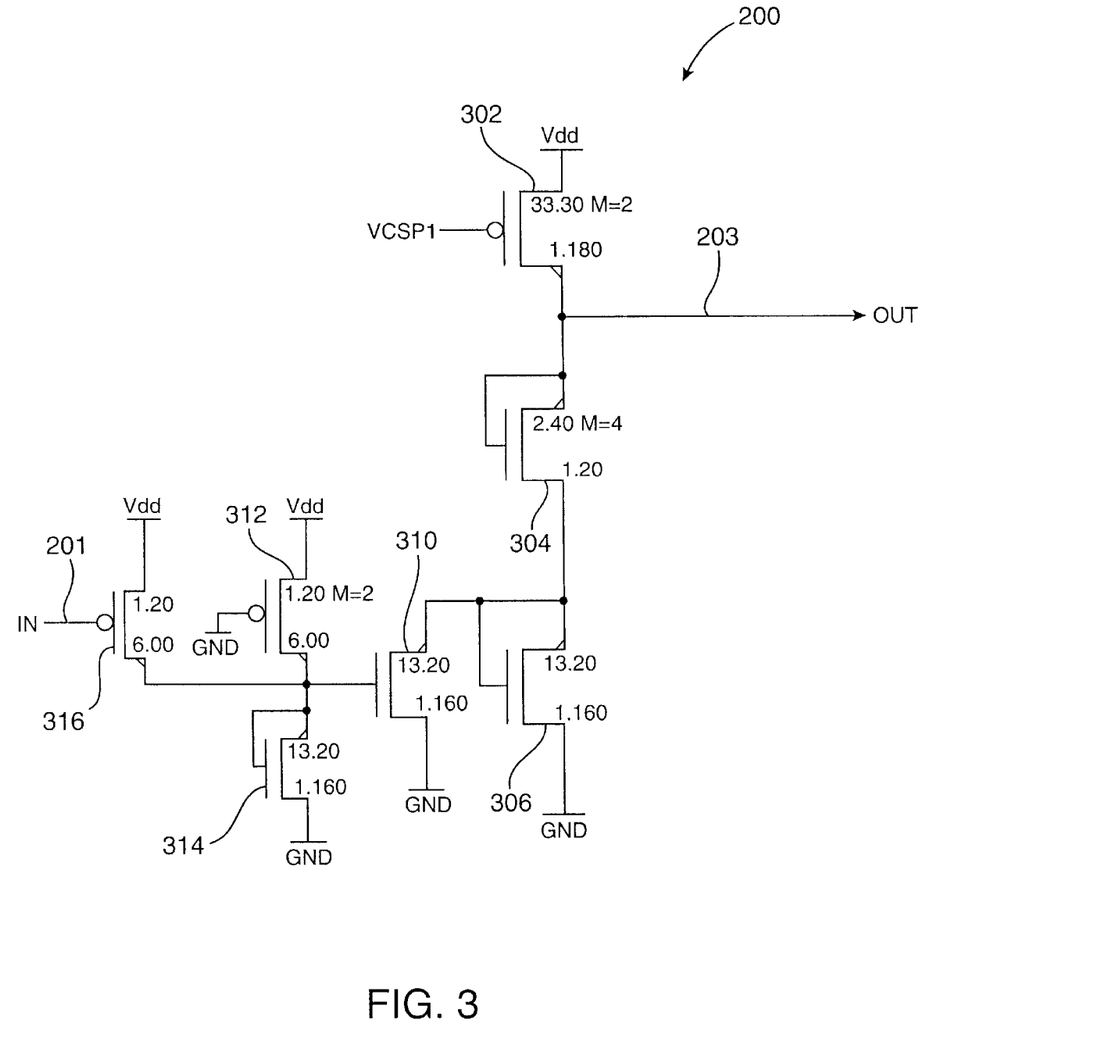
FIG. 3 is a schematic diagram of the level shifter shown in FIG. 2.

FIG. 3 is a detailed schematic of one level shifter 200. Each of the level shifters 200 shown in FIG. 2 comprise matched circuits, such as the circuit shown in FIG. 3, however other matched level shifters might be used. Level shifter 200 is shown comprising seven transistors (302, 304, 306, 310, 312, 314 and 316).

Many of the transistors shown in the figures are shown with associated widths, lengths and M values. These values are for one implementation in 0.6 micron CMOS technology, but it should be understood that the present invention can be implemented in many other technologies and many different transistor sizes. The two values in units of "u" associated with a transistor represent their width and length in microns and the "M" values (M=2, M=4, etc.) indicate where the transistor is made up of M transistors which are joined to form one effective transistor. In a preferred embodiment, the transistors are ring transistors so the effect of the circuit due to width vs. length variations are minimized. For ring transistors, which do not have explicit widths and lengths, the effective widths and lengths shown are calculated from the geometry of the ring transistors using well-known techniques.

In several instances in the circuits shown in the figures, the preferred embodiment uses match transistors, i.e. their geometries are selected so that one part of the charge pump is using the same size transistor as another part. Of course, matched transistors are only identical to within the process variations. In some places in the figures, matched transistors are indicate through the use of like-numbered transistors, such as transistors 302, 304 and 306. The reasons for the matching will be apparent to one of ordinary skill in the art from this description. Other transistors not like-numbered might also be matched as appropriate or desired.

Referring again to FIG. 3, transistors 302, 304 and 306 are shown serially coupled from Vdd to ground. Transistor 302 is a PMOS transistor with the reference voltage VCSP1 supplied to its gate, its source connected to Vdd and its drain connected to the drain and gate of transistor 304 (diode-connected), which is an NMOS transistor. The source of transistor 304 is connected to the drain and gate of transistor 306, an NMOS transistor, and the source of transistor 306 is connected to ground. The output of the level shifter is connected to the node between transistor 302 and transistor 304.

The input signal to the serially coupled transistors is communicated to the gate/drain of transistor 306 via a bias network made up of PMOS transistors 316, 312 and NMOS transistors 310, 314. The full-swing input signal is connected to the gate of transistor 316. The source of transistor 316 is connected to Vdd and the drain of transistor 316 is connected to the drains of transistors 312 and 314, as well as the gate of transistor 310. The source of transistor 312 is connected to Vdd and the source of transistor 314 is connected to ground. The gate of transistor 312 is also connected to ground. The source of transistor 310 is connected to ground and the drain of transistor 310 is connected to the gate/drain of transistor 306.

The level shifter shifts a full-swing input signal (0.0 volts to 3.3 volts) on line 210 to a smaller swing signal on its output (2.0 volts to 2.2 volts). As should be apparent from FIGS. 2–3, any common mode signal on UP and UP_ or DN and DN_ will tend to cancel out from producing a differential output since they are coupled to output stage 202 through matched level shifters.

As should be apparent from the above description, other level shifters can be used in place of the circuit shown in FIG. 3. While it is preferred that two, matched level shifters be used for the UP signal and another two be used for the DOWN signal to simplify the problem of common mode coupling at the inputs, a charge pump according to the present invention might use only one level shifter per signal.

Figure 4:
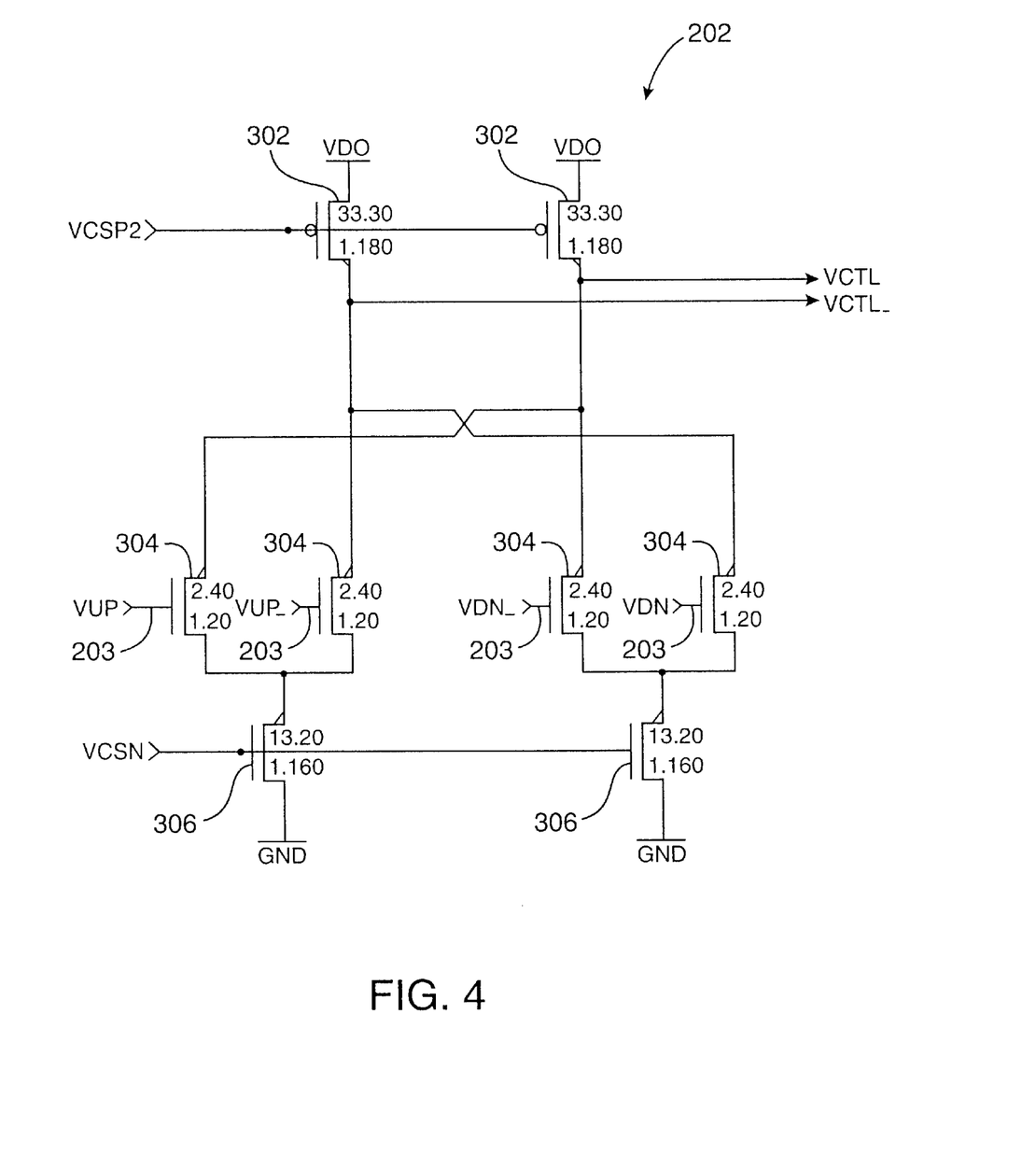
FIG. 4 is a schematic diagram of the output stage shown in FIG. 2.

FIG. 4 is a schematic showing a preferred embodiment of output stage 202. In output stage 202, each of the four intermediate signals 203 are connected to the gate of a corresponding transistor 304. Each of these four transistors 304 has its source connected to the drain of one of two transistors 306 and has its drain connected to the drain of one of two transistors 302. The outputs of output stage 202 are taken from nodes to which the drains of transistors 304 are attached.

The sources of transistors 302 are connected to Vdd and their gates are connected to the reference voltage VCSP2. The sources of transistors 306 are connected to ground and their gates are connected to VCSN, thus forming current sources.

The particular connections will now be described. The sources of the transistors 304 for VUP and VUP_ are connected together to the drain of one of the transistors 306, while the sources of the transistors for VDN and VDN_ are connected together to the drain of the other transistor 306. The drains of the transistors 304 for VUP and VDN_ are tied to the drain of the transistor 302 whose drain forms the Vctl output, while the drains of the transistors 304 for VDN and VUP_ are tied to the drain of the transistor 302 whose drain forms the Vctl_ output. Because the gates of transistors 304 switch between 2.0 volts and 2.2 volts, they are always in saturation. The small swing on these transistors allows the VUP and VDN_ delta current contributions to be combined by simply tying the lines together at the Vctl node (and the VDN and VUP_ delta currents to be combined by tying together at the Vctl_ node).

As explained below in connection with FIG. 5, the reference voltage VCSP2 is targeted to be the same bias level as VCSP1, but those two reference voltages are separately generated by matched circuits in reference bias network 204 to limit the amount of signal feedthrough that can occur between the gates of transistors 302 in level shifters 200 and the gates of transistors 302 in output stage 204.

Because transistors 304 remain in a saturated region, channel creation and destruction currents need not be handled on the output lines. As a further benefit, when the input pulse signals indicate zero delta time (i.e., when VUP, VDN pulse widths are equal), the balanced circuit of output stage 204 allows for zero delta current between Vctl and Vctl_.

In the preferred embodiment, transistors 302 are also saturated and thus, all of the transistors with drains attached to an output are saturated. Transistors 306, which are used to set a common mode voltage level, need not be saturated, but can be in their linear range, if needed.

Another benefit of operating in the saturation region is in simplifying a circuit simulation. Many simulation tools do not handle channel creation/destruction well. One reason for this is that the amount of current which flows in turn on and turn off depends on many variables. Some of these variables might cancel out using the matching described here, but other systematic mismatches will not. For example, on channel destruction, more current will flow into the VCTL_ output if this output voltage is higher than VCTL. However, when transistors stay in saturation, simulation is simplified and is therefore more reliable.

Figure 5:
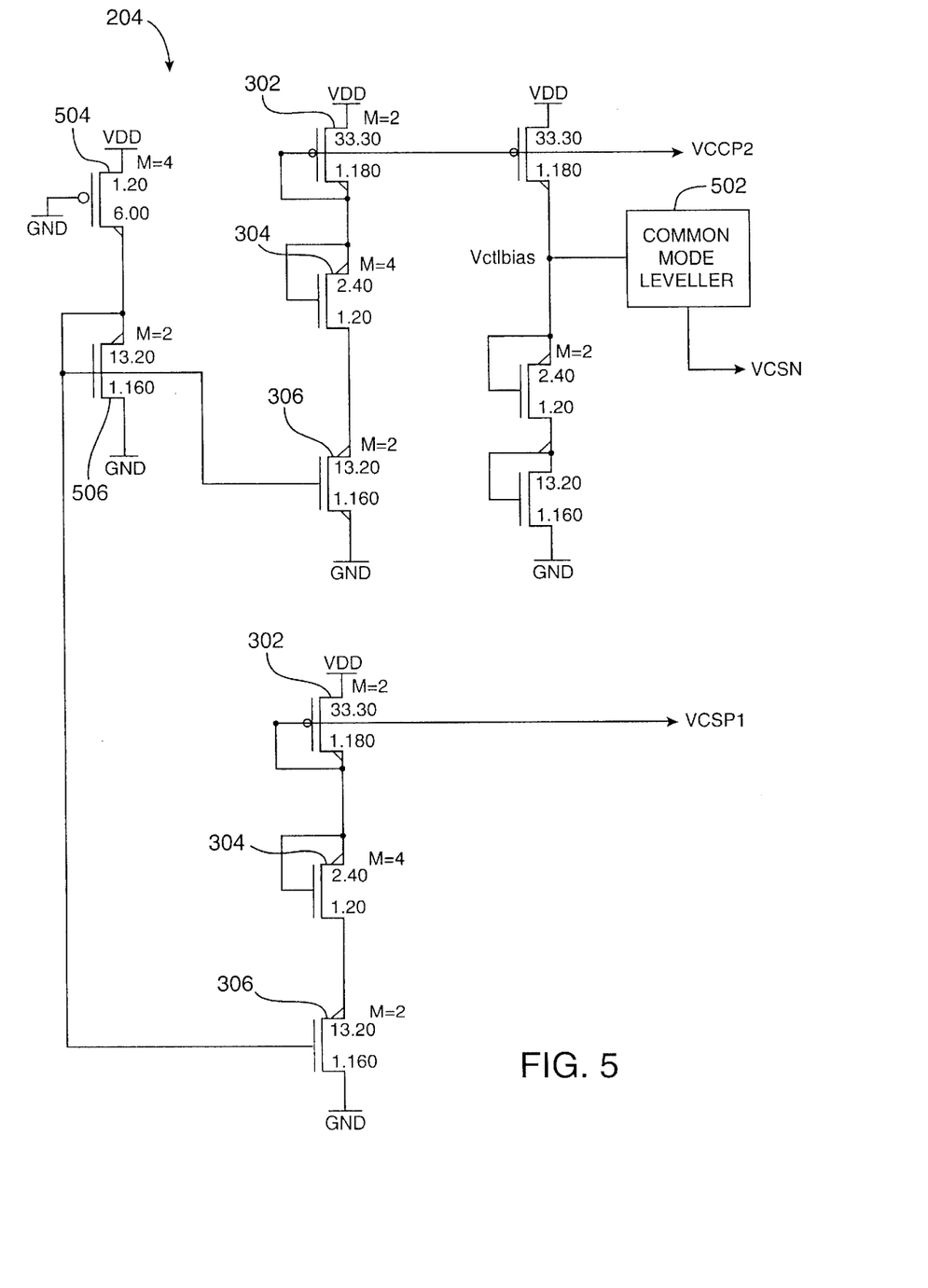
FIG. 5 is a schematic diagram of the bias network shown in FIG. 2.

FIG. 5 is a schematic diagram of reference bias network 204, which generates reference voltages VCSP1 and VCSP2 using matched, but separate, transistor sets (replica biased) to form a current mirror. Another reference voltage, VCSN, is generated from a common mode leveller 502. VCSN is used to set the base current through transistors 306 in output stage 202 to correspond roughly to the average current through transistors 306 in level shifters 200. While VCSP1 and VCSP2 are shown being internally generated, they might also be externally generated. One way to externally generate these is to apply an external reference to the gate of transistor 504 or transistor 506, or some other suitable node of bias network 204.

Figure 6:
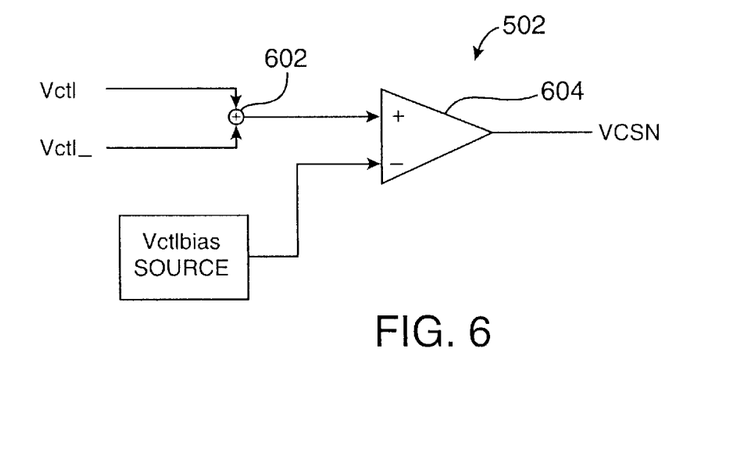
FIG. 6 is a schematic diagram of a common mode leveller as might be used in the bias network shown in FIG. 5.

FIG. 6 is a schematic diagram of common mode leveller 502 shown in FIG. 5, comprising an adder 602 and an operational amplifier ("op amp") 604. Adder 602 sums Vctl and Vctl_ (the outputs of output stage 202 shown in FIGS. 2 and 4) and applies them to a positive input of op amp 604. A source of a reference bias level, Vctlbias, is applied to a negative input of op amp 604. The output of op amp 604 is the reference voltage VCSN, which is used in output stage 202. Adder 602 effectively averages the output signals (averaging differs from adding by a factor of two, which can either be handled at the output of adder 602 or by doubling Vctlbias. Vctlbias can be set using the circuit shown in FIG. 5 or can be a reference voltage supplied external to the charge pump.

In operation, common mode leveller 502 sets the common mode level at the output of output stage 202 such that the average of the two outputs is equal to Vctlbias. It does this by controlling the voltage at the gates of transistors 306 in output stage 202. A similar circuit for common mode levelling is shown in the prior art in U.S. Pat. No. 5,422,529 issued to Lee, which is incorporated herein for all purposes (hereinafter "Lee"). Lee shows a charge pump with a current source in an output stage where the output voltages are summed and levelled to a reference voltage. As should be apparent, the preferred embodiment described herein has advantages over prior art such as Lee. But one improvement which can be made to the circuits shown by Lee is to use the level shifters described above at the inputs to Lee's differential transistors (M1 and M2 in FIG. 3 of Lee).

But one advantage of the preferred embodiment is that the common mode voltage level of the charge pump output stage and the common mode current level can be independently controlled with the common mode current level being controlled. For example, the common mode current can be set to be proportional to the current used by the VCO buffer stages, to make the PLL self-biasing. The additional common mode voltage control can keep the voltages on the loop filter capacitor from drifting to the voltage rails. Of course, a change in VCSN will cause a change in the common mode current, but the current change is small relative to the current change effected by changes in VCSP2, because the high output resistance of transistors 302 and 304 on nodes Vctl and Vctl_ amplifies small changes in the common mode current through transistors 306.

Figure 7:
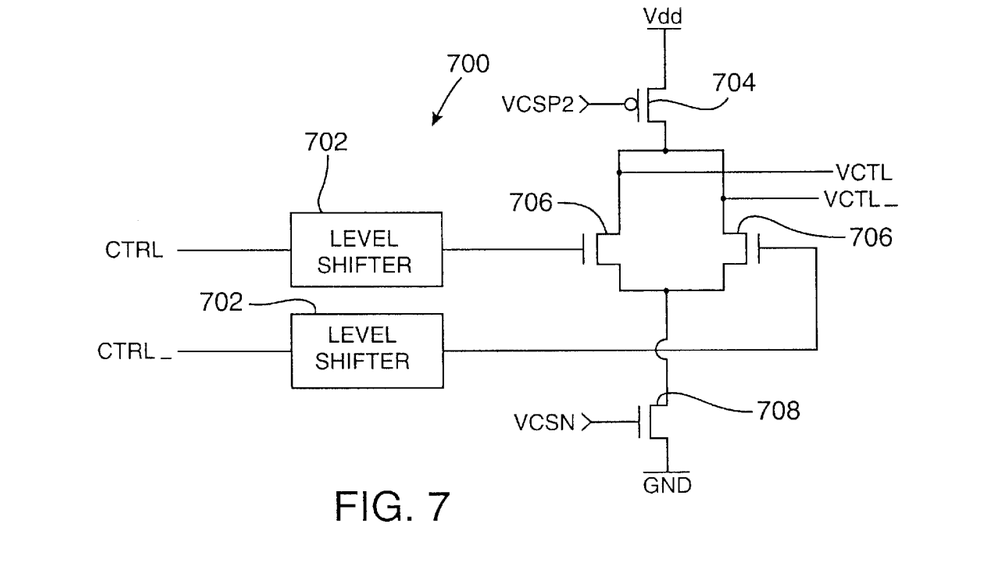
FIG. 7 is a schematic diagram of an alternate embodiment of a charge pump according to the present invention.

FIG. 7 shows a charge pump 700, which is an alternate embodiment of the present invention. The input to the charge pump is a single signal, CTRL, and its complement, CTRL_. These two signals are applied to level shifters 702, which supply an output to control transistors 706 which perform the output differential pair. As with previously described circuits, a PMOS transistor 704 with its gate coupled to VCSP2 forms a current source for the differential output pair, and an NMOS transistor 708 with a gate coupled to VCSN sets the average common mode of voltage. As with the above-described circuits, transistors 706, and preferably transistor 704, are in saturation. The control input is a combination up/down signal, wherein a high voltage might indicate that the oscillator clock lags the reference clock, a low voltage might indicate that the oscillator clock leads the reference clock, and a zero voltage indicates that the oscillator clock neither leads nor lags the reference clock.

The above description is illustrative and not restrictive. Many variations of the invention will become apparent to those of skill in the art upon review of this disclosure. For example, while common mode levelling (using VCSN) is applied to the NMOS transistors 306 in output stage 202 and current control (using VCSP2 generated by the current mirror) is applied to the PMOS transistors 302 in output stage 202, these two controls can be switched, so that the current control is applied to the NMOS transistors and the common mode level control is applied to the PMOS transistors. Another variation would be to control the common mode levels out of the level shifters 702 or 200 while inputting VCSN or VCSP2 and using a folded current mirror with no closed loop control to generate VCSP2 or VCSN, respectively.

The scope of the invention should, therefore, be determined not with reference to the above description, but instead should be determined with reference to the appended claims along with their full scope of equivalents.

What is claimed is:

1. A time-to-charge converter, responsive to a first clock input and a second clock input, which outputs a first input signal having a first signal feature and a second input signal having a second signal feature corresponding to the first signal feature and being proportional to a time delay between the first and second clock inputs, comprising:

a first level shifter, coupled to receive the first input signal, for generating a first intermediate signal;

a second level shifter, coupled to receive the second input signal, for generating a second intermediate signal;

an output differential transistor pair comprising a first transistor having a gate coupled to receive the first intermediate signal and a second transistor having a gate coupled to receive the second intermediate signal; and means for biasing the first and second transistors into a saturated region such that the first and second transistors remain in the saturated region during a process of converting a time delay into a charge.

2. The converter of claim 1, wherein the first signal feature is one of a rising edge or a falling edge and wherein the second signal feature is one of a rising edge or a falling edge.

3. The converter of claim 1, wherein each level shifter of the first level shifter and the second level shifter comprises:

a first bias network coupled to an input signal, wherein the input signal is the first input signal or the second input signal;

a second bias network coupled to a complement of the input signal;

a first level shifting circuit coupled to the first bias network; and a second level shifting circuit coupled to the second bias network.

4. The converter of claim 1, wherein the first and second transistor is a ring transistor, thereby minimizing effects of length vs. width variations in the transistor creation process.

5. The converter of claim 1, further comprising:

a first current source coupled between a power rail and the first intermediate signal;

a first current control signal source coupled to control the first current source;

a second current source coupled between the power rail and the second intermediate signal;

a second current control signal source coupled to control the first current source;

means for controlling a common mode voltage level on the charge pump outputs, which sets an average of the first and second charge pump outputs to a voltage which is a function of a common mode reference voltage, whereby a common mode current and a common mode voltage at the charge pump outputs are separately controllable.

6. A charge pump for use in a phase-lock loop circuit, wherein the charge pump is used to adjust a charge on a capacitor at an input of a voltage controlled oscillator comprising:

an output differential transistor pair, each coupled to a charge pump output;

means for biasing each transistor of the output differential transistor pair into a saturated region; and a common mode leveling circuit coupled to the output differential transistor pair to set a common mode voltage at the charge pump outputs.

7. A charge pump for use in a phase-lock loop circuit, wherein the charge pump is used to adjust a charge on a capacitor at an input of a voltage controlled oscillator comprising:

an output differential transistor pair, each coupled to a charge pump output; and means for biasing each transistor of the output differential transistor pair into a saturated region;

wherein an input to the charge pump comprises a control signal and its complement, wherein the control signal has one polarity relative to its complement when an oscillator clock lags a reference clock and an opposite polarity when the oscillator clock leads the reference clock.

8. The charge pump of claim 6, wherein the means for biasing comprises:

a current source, controlled to pass a current as a function of a reference signal;

a first diode-connected transistor coupled in a series with the current source;

a second diode-connected transistor coupled in series with the current source and the first diode-connected transistor;

an input node between the two diode-connected transistors adapted to receive an input signal to be level shifted; and an output node between the current source and the first diode-connected transistor adapted to output the level shifted signal.

9. The charge pump of claim 7, wherein the means for biasing comprises:

a current source, controlled to pass a current as a function of a reference signal;

a first diode-connected transistor coupled in a series with the current source;

a second diode-connected transistor coupled in series with the current source and the first diode-connected transistor;

an input node between the two diode-connected transistors adapted to receive an input signal to be level shifted; and an output node between the current source and the first diode-connected transistor adapted to output the level shifted signal.

* * * * *